(12) United States Patent
Hezar et al.

(10) Patent No.: US 8,654,867 B2
(45) Date of Patent: Feb. 18, 2014

(54) TRANSFORMER POWER COMBINER WITH FILTER RESPONSE

(75) Inventors: Rahmi Hezar, Allen, TX (US); Lei Ding, Plano, TX (US); Joonhoi Hur, Dallas, TX (US); Baher S. Haroun, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 133 days.

(21) Appl. No.: 13/313,971

(22) Filed: Dec. 7, 2011

(65) Prior Publication Data

US 2013/0148760 A1 Jun. 13, 2013

(51) Int. Cl.
H04L 25/00 (2006.01)

(52) U.S. Cl.
USPC ........... 375/258; 375/261; 375/297; 330/280; 330/84; 330/123; 330/124 R; 330/165

(58) Field of Classification Search
USPC ......... 375/258, 261, 268, 269, 272, 295, 297; 330/276, 280, 286, 54, 84, 123, 124 R, 330/127, 165, 188, 195
See application file for complete search history.

(56) References Cited

U.S. PATENT DOCUMENTS

| | | | |
|---|---|---|---|
| 5,638,401 | A | 6/1997 | Jones |
| 7,221,915 | B2 | 5/2007 | Tripp et al. |
| 7,777,570 | B2 | 8/2010 | Lai |
| 8,198,950 | B2 * | 6/2012 | Yamanouchi et al. ........ 332/145 |
| 2007/0201581 | A1 | 8/2007 | Poojan et al. |
| 2007/0298732 | A1 * | 12/2007 | Lee et al. ...................... 455/102 |
| 2011/0050344 | A1 | 3/2011 | He et al. |
| 2011/0129037 | A1 | 6/2011 | Staszewski et al. |
| 2012/0188024 | A1 * | 7/2012 | Yamanouchi ................. 332/108 |

OTHER PUBLICATIONS

"A 5.8 GHz 1 V Linear Power Amplifier Using a Novel On-Chip Transformer Power Combiner in Standard 90 nm CMOS," IEEE Journal of Solid-State Circuits, vol. 43, No. 5, May 2008, pp. 1054-1063 (Haldi, et al.).
"A 1V 17.9dBm 60GHz Power Amplifier in Standard 65nm CMOS," 2010 IEEE International Solid-State Circuits Conference (ISSCC), Feb. 10, 2010, pp. 424-425 (Lai, et al.).
"A 77 GHz Power Amplifier Using Transformer-Based Power Combiner in 90 nm CMOS," 2010 IEEE Custom Integrated Circuits Conference (CICC), Sep. 19-22, pp. 1-4 (Chang, et al.).
"A Linear Multi-Mode CMOS Power Amplifier With Discrete Resizing and Concurrent Power Combining Structure," IEEE Journal of Solid-State Circuits, vol. 46, No. 5, May 2011, pp. 1034-1048 (Kim, et al.) Jihwan Kim.
PCT Search Report mailed Mar. 29, 2013.

* cited by examiner

*Primary Examiner* — Dac Ha
(74) *Attorney, Agent, or Firm* — Alan A. R. Cooper; W. James Brady, III; Frederick J. Telecky, Jr.

(57) ABSTRACT

A method for generating an amplified radio frequency (RF) signal is provided. In-phase (I) and quadrature (Q) signals are received and interleaved so as to generate a time-interleaved signal. Delayed time-interleaved signals are then generated from the time interleaved signal, and each of the delayed time-interleaved signals is amplified so as to generate a plurality of amplified signals. The amplified signals are then combined with a transformer, where the delayed time-interleaved signals are arranged to generate a filter response with the transformer.

15 Claims, 3 Drawing Sheets

TRANSFORMER POWER COMBINER WITH FILTER RESPONSE

TECHNICAL FIELD

The invention relates generally to transformer power combiners and, more particularly, to transformer power combiners with a filter response.

BACKGROUND

Turning to FIG. 1, an example of a conventional radio frequency (RF) transmitter 200 can be seen. As shown in this example, RF circuitry is included on an integrated circuit (IC) 102 that uses a transformer combiner to generate the desired power. The scheme employed by the IC 102 is a polar modulation scheme, which uses a polar modulator 108 to decompose in-phase (I) and quadrature (Q) signals into amplitude and phase. The phase information is provided to the power amplifiers 112-1 to 112-4 (PAs), which are digital PAs, and the amplitude information is provided to the power controller 110, which controls the power output of each of PAs 112-1 to 112-4. Since each of the PAs 112-1 to 112-4 receive the same signal and the respective outputs are applied to primary windings 116-1 to 116-4 of transformer 114, the power from each "branch" can be added together by secondary winding 108 to generate an output signal for IC 102. Depending on the amount of deliverable power desired, the number of PAs 112-1 to 112-4 can be increased or decreased.

One issue with this transmitter 100 is that there is no filter response introduced that allows for any analog filtering. The usual reason is that phase modulation is very sensitive, and introduction of predistortion to induce a filter response would create a mismatch between the power controller 110 and the PAs 112-1 to 112-4. As a result, an off-chip band-pass filter 104 is provided between the IC 102 and load 106 (which may be an antenna and matching circuitry). Other conventional RF transmitter also have similar drawbacks. For example, quadrature modulators usually includes an off-chip PA, and Linear Amplification with Nonlinear Components (LINC) transmitters usually include off-chip Wilkinson combiners and band-pass filters. Thus, there is a need for an improved RF transmitter.

Some example of other conventional systems are: Haldi et al., "A 5.8 GHz 1 V Linear Power Amplifier Using a Novel On-Chip Transformer Power Combiner in Standard 90 nm CMOS," *IEEE J. of Solid-State Circuits*, Vol. 43, No. 5, May 2008, pp. 1054-1063; Lai et al., "A 1V 17.9 dBm 60 GHz Power Amplifier in Standard 65 nm CMOS," 2010 *IEEE Intl. Solid-State Circuits Conf.* (ISSCC), Feb. 10, 2010, pp. 424-425; Chang et al., "A 77 GHz Power Amplifier Using Transformer-Based Power Combiner in 90 nm CMOS," 2010 *IEEE Custom Integrated Circuits Conf.* (CICC), Sep. 19-22, 2010, pp. 1-4; Kim et al., "A Linear Multi-Mode CMOS Power Amplifier With Discrete Resizing and Concurrent Power Combining Structure," *IEEE J. of Solid-State Circuits*, Vol. 46, No. 5, May 2011; and U.S. Pat. No. 7,777,570.

SUMMARY

An embodiment of the present invention, accordingly, provides an apparatus. The apparatus comprises an interleaver that is configured to receive an in-phase (I) signal and a quadrature (Q) signal; a distribution circuit that is coupled to the interleaver; a plurality of power amplifiers (PAs), wherein each PA is coupled to the distribution circuit; and a transformer having a plurality of primary windings and a secondary winding, wherein each primary winding is coupled to at least one of the PAs, and wherein the distribution circuit introduces at least one of a plurality of delays between the output of the interleaver and each PA so as to generate a filter response with the transformer.

In accordance with an embodiment of the present invention, the distribution circuit further comprises: a plurality of channels, wherein each channel is coupled to at least one of the PAs; and a plurality of delay circuits, wherein each delay circuit is coupled between at least two of the channels.

In accordance with an embodiment of the present invention, the plurality of channels further comprises a first set of channels and a second set of channels that are interleaved with one another, and wherein each channel from the second set of channels further comprises an inverter.

In accordance with an embodiment of the present invention, the interleaver further comprises: a first mixer that is configured to receive the I signal and a first interleaving signal; a second mixer that is configured to receive the Q signal and a second interleaving signal; and a combiner that is coupled to the first mixer, the second mixer, and the distribution circuit.

In accordance with an embodiment of the present invention, the apparatus further comprises a band-pass filter that is coupled to the secondary winding of the transformer.

In accordance with an embodiment of the present invention, the first and second interleaving signals are 90° out-of-phase.

In accordance with an embodiment of the present invention, a method is provided. The method comprises receiving I and Q signals; interleaving the I and Q signals so as to generate a time-interleaved signal; generating a plurality of delayed time-interleaved signals from the time interleaved signal; amplifying each of the delayed time-interleaved signals so as to generate a plurality of amplified signals; and combining the amplified signals with a transformer, wherein the delayed time-interleaved signals are arranged to generate a filter response with the transformer.

In accordance with an embodiment of the present invention, the step of generating further comprises: delaying the time-interleaved signal by a first amount to generate a first delayed time-interleaved signal from the plurality of delayed time-interleaved signals; delaying the time-interleaved signal by a second amount to generate a second delayed time-interleaved signal from the plurality of delayed time-interleaved signals, wherein the second amount is the sum of the first amount and a predetermined delay; delaying the time-interleaved signal by a third amount to generate a third delayed time-interleaved signal from the plurality of delayed time-interleaved signals, wherein the third amount is the sum of the second amount and the predetermined delay; and delaying the time-interleaved signal by a fourth amount to generate a fourth delayed time-interleaved signal from the plurality of delayed time-interleaved signals, wherein the fourth amount is the sum of the third amount and the predetermined delay.

In accordance with an embodiment of the present invention, the step of interleaving further comprises: mixing the I signal with a first interleaving signal; mixing the Q signal with a second interleaving signal; and combining the mixed I and Q signals to generate the time-interleaved signal.

In accordance with an embodiment of the present invention, the steps of mixing and combining the mixed I and Q signals further comprise: outputting, during a first period of the first and second interleaving signals, the I signal; outputting, during a second period of the first and second interleaving signals, the Q signal; outputting, during a third period of the first and second interleaving signals, an inverse of the I signal; and outputting, during a fourth period of the first and second interleaving signals, an inverse of the Q signal.

In accordance with an embodiment of the present invention, the steps of delaying the time-interleaved signal by the second amount and delaying the time-interleaved signal by the fourth amount further comprise: delaying and inverting the time-interleaved signal by the second amount to generate the second delayed time-interleaved signal; and delaying and inverting the time-interleaved signal by the fourth amount to generate the third delayed time-interleaved signal.

In accordance with an embodiment of the present invention, an apparatus is provided. The apparatus comprises an interleaver that is configured to receive an I signal and a Q signal; a distribution circuit that is coupled to the interleaver so as to generate first, second, third, and fourth delayed time-interleaved signals; a first PA that is coupled to the distribution circuit so as to receive the first delayed time-interleaved signal; a second PA that is coupled to the distribution circuit so as to receive the second delayed time-interleaved signal; a third PA that is coupled to the distribution circuit so as to receive the third delayed time-interleaved signal; a fourth PA that is coupled to the distribution circuit so as to receive the fourth delayed time-interleaved signal; a transformer having a first primary winding, a second primary winding, a third primary winding, a fourth primary winding, and a secondary winding, wherein the first primary winding is coupled to the first PA, and wherein the second primary winding is coupled to the second PA, and wherein the third primary winding is coupled to the third PA, and wherein the fourth primary winding is coupled to the fourth PA, and wherein the first, second, third, and fourth delayed time-interleaved signals are introduced so as to generate a filter response with the transformer.

In accordance with an embodiment of the present invention, the distribution circuit further comprises: a first channel that is coupled between the interleaver and the first PA; a first delay circuit that is coupled to the interleaver; a second channel that is coupled between the first delay circuit and the second PA; a second delay circuit that is coupled to the first delay circuit; a third channel that is coupled between the second delay circuit and the third PA; a third delay circuit that is coupled to the second delay circuit; and a fourth channel that is coupled between the third delay circuit and the fourth PA.

In accordance with an embodiment of the present invention, the second and fourth channels further comprise first and second inverters, respectively.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
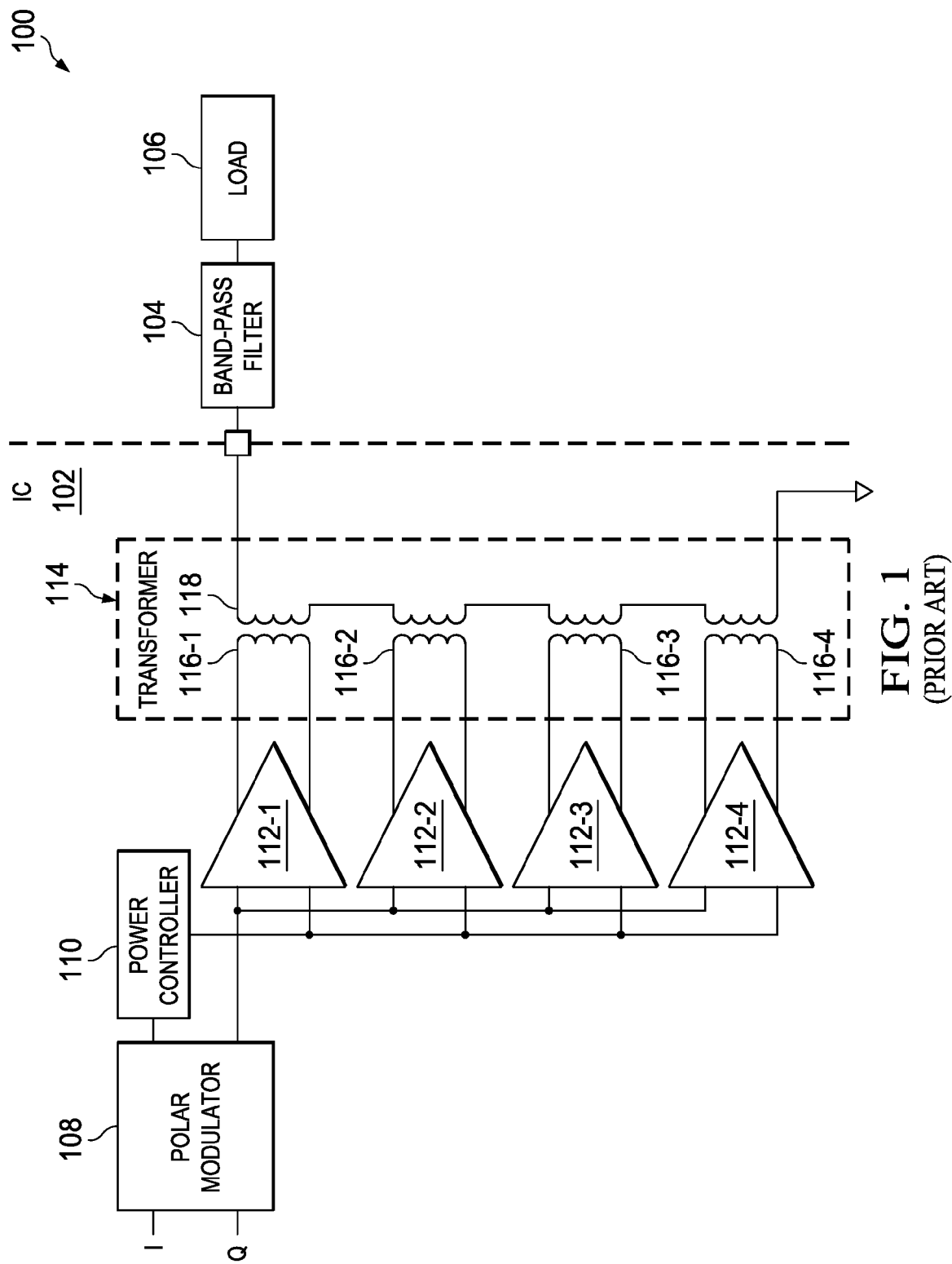
FIG. 1 is a diagram of an example of a conventional RF transmitter.

Refer now to the drawings wherein depicted elements are, for the sake of clarity, not necessarily shown to scale and wherein like or similar elements are designated by the same reference numeral through the several views.

Figure 2:
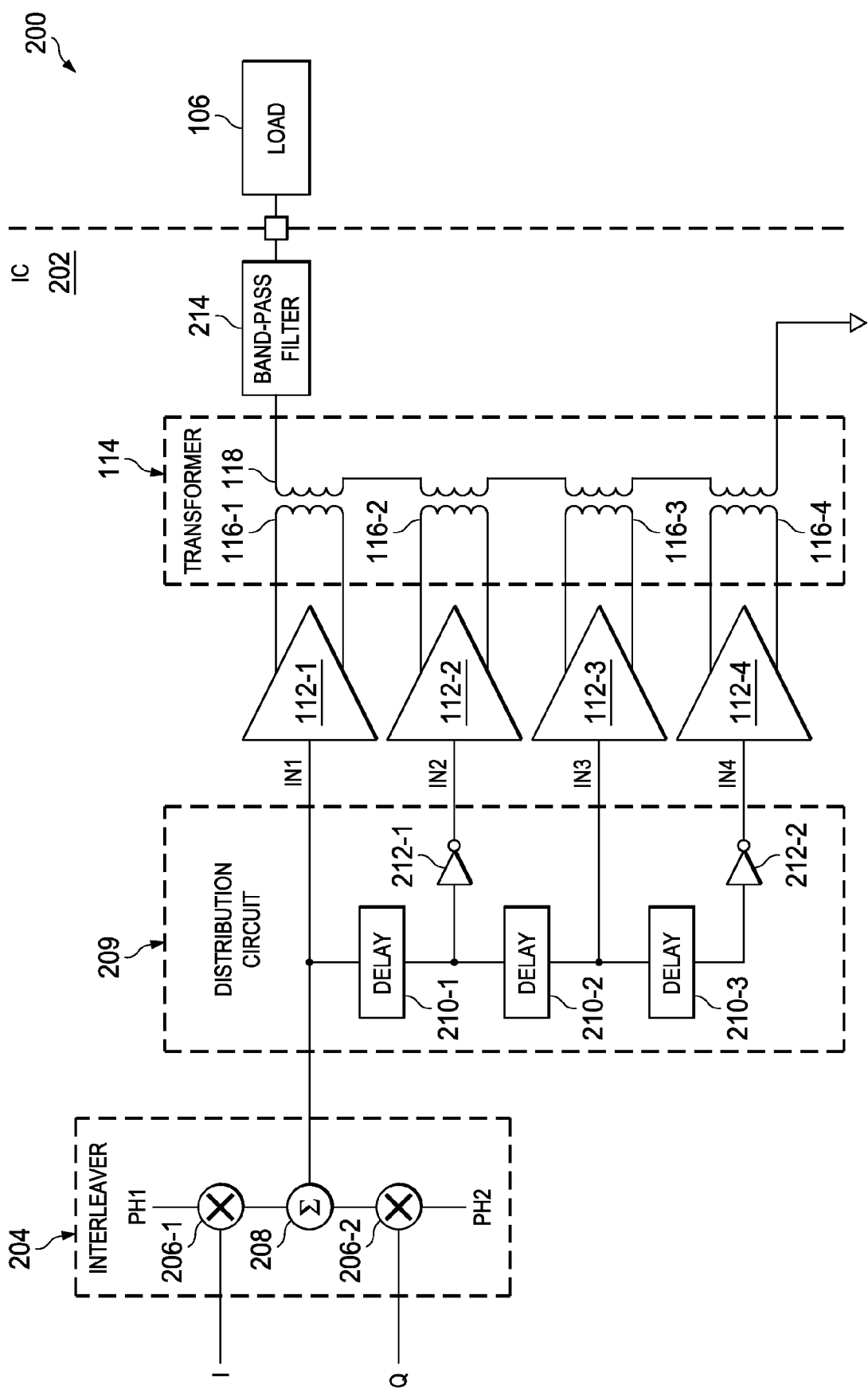
FIG. 2 is a diagram of an example of an RF transmitter in accordance with an embodiment of the present invention.

Turning to FIG. 2, an example of an RF transmitter 200 in accordance with an embodiment of the present invention can be seen. As shown, the transmitter includes transformer 114 and PAs 112-1 to 112-4, similar to system 100. In this example, four PAs 112-1 to 112-4 are shown for the sake of illustration, but depending on the desired output power the number can be increased or decreased. Transmitter 200, however, does not operate based on polar modulation but, instead, operates as a time-interleaved pulse width modulation (PWM) transmitter. To do this, the I and Q signals are upsampled at a rate of four times the center frequency $F_C$. The interleaver 204 (which generally comprises mixers 206-1 and 206-2 and combiner or adder 208) then interleaves the I and Q signals into a single stream using interleaving signals PH1 and PH2. The distribution circuit 209 (which generally comprises delay circuits 210-1 to 210-3 and inverters 212-1 and 212-2) then distributes the interleaved stream to PAs 112-1 to 112-4, where, in this example, there is a channel for each of the PAs 112-1 to 112-4. The distribution circuit 209 also introduces a delay for each channel generating signals IN1 to IN4 that would create a filter response with the transformer 114 (namely, an analog finite impulse response). Since a filter response is created or introduced with transformer 114, an on-chip band-pass filter 214 can be used instead of an off-chip band-pass filter (i.e., 104), reducing cost.

Figure 3:
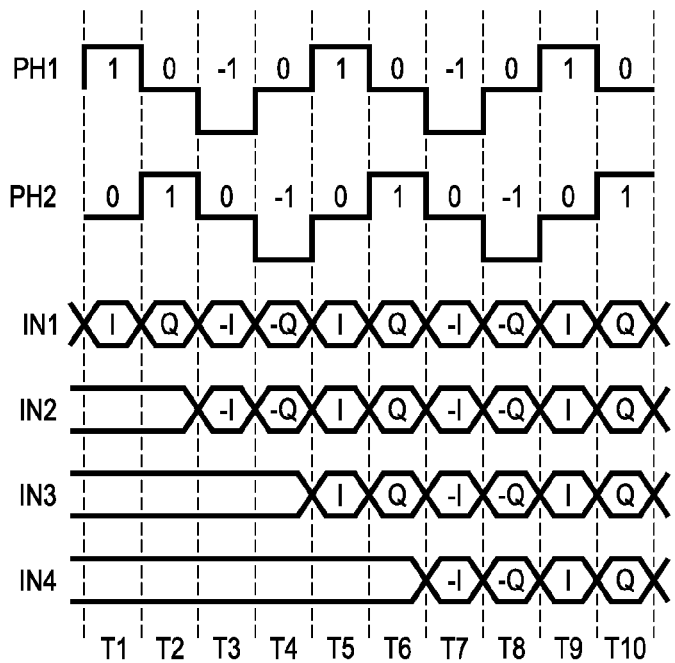
FIG. 3 is an example of a timing diagram depicting the operation of the interleaver and distribution circuit of FIG. 2.
Figure 4:
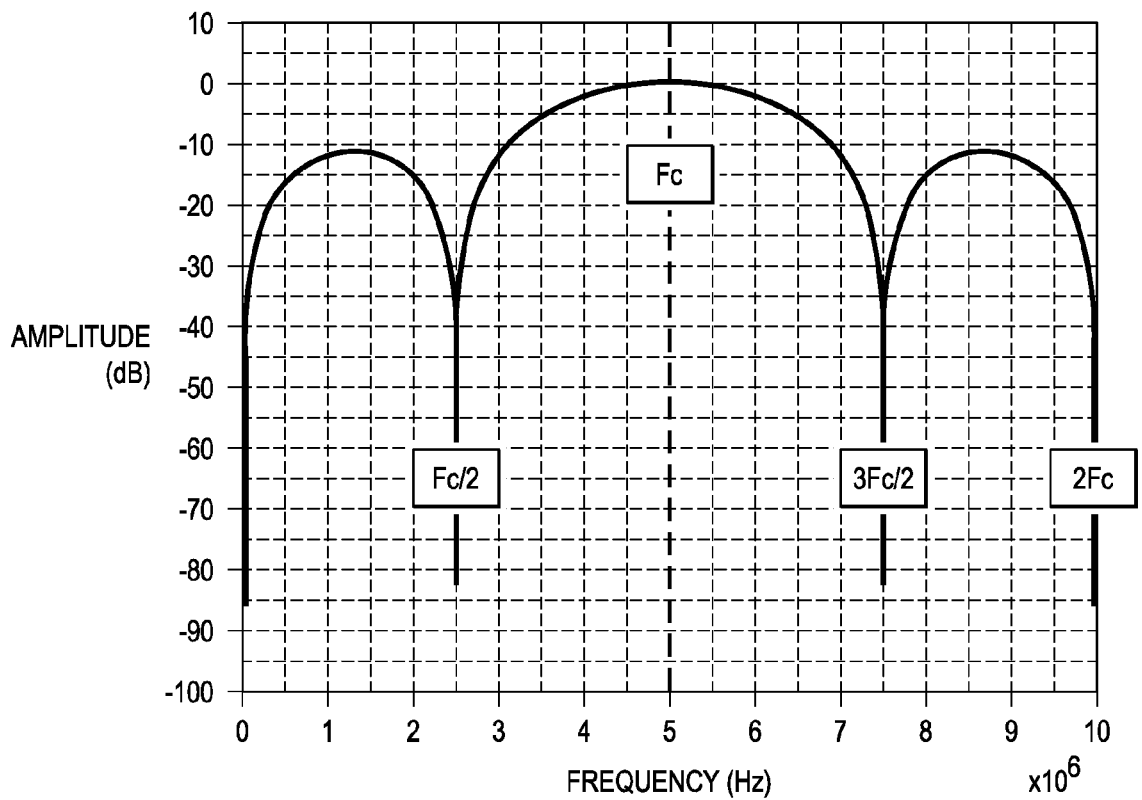
FIG. 4 is a diagram of the filter response of the transmitter of FIG. 2.

To illustrate the operation of transmitter, a timing diagram is shown in FIG. 3. As shown in this example, the interleaving signals PH1 and PH2 have a cycle of 0→1→0→−1→0 and are 90° out-of-phase with one another. In period T1, signals PH1 and PH2 are 1 and 0, respectively, which allows the I signal to be provided as signal IN1 (with the channel for PA 112-1 having a nominal delay). In period T2, signals PH1 and PH2 are 0 and 1, respectively, allowing the Q signal to be provided as signal IN1. In period T3, signals PH1 and PH2 are −1 and 0, respectively, allowing an inverse of the I signal to be provided as signal IN1. Additionally, because of the use of delay circuit 210-1 (which is generally a ½ cycle delay but the length of the delay is usually related to the upsample rate and/or the number of PAs), the channel for PA 112-2 receives the I signal from period T1, which is then inverted by inverter 212-1 and provided as signal IN2. Similarly, for period T4, an inverse of the Q signal is provided as signals IN1 and IN2, and a similar result is shown for periods T5 to T10 for signals IN1 to IN4. As should be apparent, the structure of the distribution circuit 209 (which is similar to the construction for a finite impulse response (FIR) filter) and the timings for the interleaving signals PH1 and PH2, the signals IN1 to IN4 are the same or are "aligned." This creates notches at certain frequencies (as shown, for example, in FIG. 4 with notches at $F_C/2$, $3F_C/2$, and $2F_C$), which is the filter response created with transformer 114.

As a result of employing the interleaver 204 and distribution circuit 209 in a manner so as to create a filter response with transformer 114, several advantages can be realized. A complete on-chip combining of the I and Q signals along with parallel PAs 112-1 to 112-4 through a transformer 114 to increase the total output power is also achieved. As an example, if individual PAs 112-1 to 112-4 can deliver 250 mW of power, the combined power output can be 1 W with fully integrated solution. The filter response with transformer 114 also provides a sufficient amount of suppression that relaxes requirements for analog band-pass filter 214 following the transformer 114, allowing for an on-chip implementation with a low Q-factor. Additionally, adding more parallel PAs (greater than the four shown) to reach higher output power creates more room to improve the filter response of the transformer with more notch locations and better stop-band attenuation. Moreover, the fully digital transmitter architecture allows flexibility to adjust out-of-band noise and image cancellation using different PWM schemes to meet the spectral mask requirements without using external off-chip components.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
   an interleaver that is configured to receive an in-phase (I) signal and a quadrature (Q) signal;
   a distribution circuit that is coupled to the interleaver;
   a plurality of power amplifiers (PAs), wherein each PA is coupled to the distribution circuit; and
   a transformer having a plurality of primary windings and a secondary winding, wherein each primary winding is coupled to at least one of the PAs, and wherein the distribution circuit introduces at least one of a plurality of delays between the output of the interleaver and each PA so as to generate a filter response with the transformer,
   wherein the distribution circuit further comprises:
      a plurality of channels, wherein each channel is coupled to at least one of the PAs; and
      a plurality of delay circuits, wherein each delay circuit is coupled between at least two of the channels.

2. The apparatus of claim 1, wherein the plurality of channels further comprises a first set of channels and a second set of channels that are interleaved with one another, and wherein each channel from the second set of channels further comprises an inverter.

3. The apparatus of claim 2, wherein the interleaver further comprises:
   a first mixer that is configured to receive the I signal and a first interleaving signal;
   a second mixer that is configured to receive the Q signal and a second interleaving signal; and
   a combiner that is coupled to the first mixer, the second mixer, and the distribution circuit.

4. The apparatus of claim 3, wherein the apparatus further comprises a band-pass filter that is coupled to the secondary winding of the transformer.

5. The apparatus of claim 4, wherein the first and second interleaving signals are 90° out-of-phase.

6. A method comprising:
   receiving I and Q signals;
   interleaving the I and Q signals so as to generate a time-interleaved signal;
   generating a plurality of delayed time-interleaved signals from the time interleaved signal;
   amplifying each of the delayed time-interleaved signals so as to generate a plurality of amplified signals; and
   combining the amplified signals with a transformer, wherein the delayed time-interleaved signals are arranged to generate a filter response with the transformer,
   wherein the step of generating further comprises:
   delaying the time-interleaved signal by a first amount to generate a first delayed time-interleaved signal from the plurality of delayed time-interleaved signals;
   delaying the time-interleaved signal by a second amount to generate a second delayed time-interleaved signal from the plurality of delayed time-interleaved signals, wherein the second amount is the sum of the first amount and a predetermined delay;
   delaying the time-interleaved signal by a third amount to generate a third delayed time-interleaved signal from the plurality of delayed time-interleaved signals, wherein the third amount is the sum of the second amount and the predetermined delay; and
   delaying the time-interleaved signal by a fourth amount to generate a fourth delayed time-interleaved signal from the plurality of delayed time-interleaved signals, wherein the fourth amount is the sum of the third amount and the predetermined delay.

7. The method of claim 6, wherein the step of interleaving further comprises:
   mixing the I signal with a first interleaving signal;
   mixing the Q signal with a second interleaving signal; and
   combining the mixed I and Q signals to generate the time-interleaved signal.

8. The method of claim 7, wherein the steps of mixing and combining the mixed I and Q signals further comprise:
   outputting, during a first period of the first and second interleaving signals, the I signal;
   outputting, during a second period of the first and second interleaving signals, the Q signal;
   outputting, during a third period of the first and second interleaving signals, an inverse of the I signal; and
   outputting, during a fourth period of the first and second interleaving signals, an inverse of the Q signal.

9. The method of claim 8, wherein the steps of delaying the time-interleaved signal by the second amount and delaying the time-interleaved signal by the fourth amount further comprise:
   delaying and inverting the time-interleaved signal by the second amount to generate the second delayed time-interleaved signal; and
   delaying and inverting the time-interleaved signal by the fourth amount to generate the third delayed time-interleaved signal.

10. An apparatus comprising:
    an interleaver that is configured to receive an I signal and a Q signal;
    a distribution circuit that is coupled to the interleaver so as to generate first, second, third, and fourth delayed time-interleaved signals;
    a first PA that is coupled to the distribution circuit so as to receive the first delayed time-interleaved signal;

a second PA that is coupled to the distribution circuit so as to receive the second delayed time-interleaved signal;
a third PA that is coupled to the distribution circuit so as to receive the third delayed time-interleaved signal;
a fourth PA that is coupled to the distribution circuit so as to receive the fourth delayed time-interleaved signal;
a transformer having a first primary winding, a second primary winding, a third primary winding, a fourth primary winding, and a secondary winding, wherein the first primary winding is coupled to the first PA, and wherein the second primary winding is coupled to the second PA, and wherein the third primary winding is coupled to the third PA, and wherein the fourth primary winding is coupled to the fourth PA, and wherein the first, second, third, and fourth delayed time-interleaved signals are introduced so as to generate a filter response with the transformer.

11. The apparatus of claim 10, wherein the distribution circuit further comprises:
a first channel that is coupled between the interleaver and the first PA;
a first delay circuit that is coupled to the interleaver;
a second channel that is coupled between the first delay circuit and the second PA;
a second delay circuit that is coupled to the first delay circuit;
a third channel that is coupled between the second delay circuit and the third PA;
a third delay circuit that is coupled to the second delay circuit; and
a fourth channel that is coupled between the third delay circuit and the fourth PA.

12. The apparatus of claim 11, wherein the second and fourth channels further comprise first and second inverters, respectively.

13. The apparatus of claim 12, wherein the interleaver further comprises:
a first mixer that is configured to receive the I signal and a first interleaving signal;
a second mixer that is configured to receive the Q signal and a second interleaving signal; and
a combiner that is coupled to the first mixer, the second mixer, and the distribution circuit.

14. The apparatus of claim 13, wherein the apparatus further comprises a band-pass filter that is coupled to the secondary winding of the transformer.

15. The apparatus of claim 14, wherein the first and second interleaving signals are 90° out-of-phase.

* * * * *